United States Patent [19]

Hennenhoefer et al.

[11] Patent Number: 5,737,578
[45] Date of Patent: Apr. 7, 1998

[54] APPARATUS AND METHOD FOR PARTITIONING MULTIPORT RAMS

[75] Inventors: Eric Todd Hennenhoefer, Essex Jct.; Jonathan Henry Raymond, Underhill, both of Vt.

[73] Assignee: International Business Machines Corp., Armonk, N.Y.

[21] Appl. No.: 341,775

[22] Filed: Nov. 18, 1994

[51] Int. Cl.[6] ................................................ G06F 12/00
[52] U.S. Cl. .................. 395/500; 395/527; 395/495; 364/578; 364/488; 364/238; 364/DIG. 1; 371/22.3
[58] Field of Search ................................ 364/578, 488, 364/489, 200, 246.3, 244.8; 395/500, 900, 527, 568, 495; 371/22.3, 25.1

[56] References Cited

U.S. PATENT DOCUMENTS

| | | | |
|---|---|---|---|
| 4,463,421 | 7/1984 | Laws | 364/200 |
| 4,503,386 | 3/1985 | DasGupta et al. | 324/73 R |
| 4,697,241 | 9/1987 | Lavi | 364/488 |
| 4,740,894 | 4/1988 | Lyon | 364/200 |
| 4,766,535 | 8/1988 | Aueibach et al. | 364/200 |
| 4,789,924 | 12/1988 | Fukuta | 364/200 |
| 4,845,677 | 7/1989 | Chappell et al. | 365/189.02 |
| 4,849,928 | 7/1989 | Hauck | 364/900 |
| 4,872,125 | 10/1989 | Catlin | 364/578 |
| 4,967,340 | 10/1990 | Dawes | 364/200 |
| 5,036,473 | 7/1991 | Butts et al. | 364/489 |
| 5,109,353 | 4/1992 | Sample et al. | 4/578 |
| 5,204,841 | 4/1993 | Chappel et al. | 365/230.05 |
| 5,309,045 | 5/1994 | Saeki et al. | 307/405 |
| 5,325,512 | 6/1994 | Takahashi | 395/500 |
| 5,327,361 | 7/1994 | Long et al. | 364/507 |
| 5,329,470 | 7/1994 | Sample et al. | 364/578 |
| 5,329,471 | 7/1994 | Swoboda et al. | 364/578 |
| 5,375,225 | 12/1994 | Dean et al. | 395/500 |

OTHER PUBLICATIONS

Pearce et al., "Multi–Level Logic Synthesis for Concurrent Login CLi6000 Devices," IEEE, pp. 1–4.

Quenot et al., "A Reconfigurable Compute Engine for Real Time Vision Automata Prototyping," IEEE, 1994, pp. 91–100.

Suganuma et al., "Reconfigurable Machine and its Application to Logic Diagnosis", IEEE, 1992, pp. 373–376.

Butts et al., "An Efficient Logic Emulation System," IEEE, 1992, pp. 138–141.

Varghese et al., "An Efficient Logic Emulation System," IEEE, 1993, pp. 171–174.

Brian Box, "Fidd Programmable Gate Array Based Reconfigurable Processor," IEEE, 1994, pp. 40–48.

*Primary Examiner*—Kevin J. Teska
*Assistant Examiner*—Thai Phan
*Attorney, Agent, or Firm*—Calfee, Halter & Griswold LLP; Sean T. Moorhead, Esq.; Eugene Shkurko, Esq.

[57] ABSTRACT

Apparatus and method for emulating a circuit having at least one multiport RAM that requires at least two programmable device to be emulated. The multiport RAM has an array of storage elements, a read multiplexer, and a write multiplexer and is partitioned into a number of slices, each of which is capable of being programmed into one of an array of programmable devices. In one embodiment, each slice is another multiport RAM having the same depth, number of read ports, and number of write ports as the multiport RAM being emulated, but having a narrower width than the multiport RAM being emulated. In another embodiment, the multiport RAM is partitioned into read slices and write slices, which will typically be of different widths. The read slices comprise the read multiplexers. The write slices comprise the array of storage elements and the write multiplexers.

25 Claims, 6 Drawing Sheets

5,737,578

APPARATUS AND METHOD FOR PARTITIONING MULTIPORT RAMS

FIELD OF THE INVENTION

The present invention relates generally to hardware emulation of circuits and, more specifically, to an apparatus and method for partitioning complex multiport RAMs in such a manner that the number of programmable gate arrays needed to emulate a particular multiport RAM is reduced to one-half to one-sixth the number needed by prior art systems.

BACKGROUND OF THE INVENTION

As electronic components and electronic systems become more complex, the design and testing of these components and systems has become a more time consuming and demanding task. Recently, software simulation of electronic components and systems has become a less important tool for designers. Software simulations suffer from several major limitations, e.g., the slow speed of the simulation and inability to actually connect a simulation of one part of a design to an actual physical implementation of another part of the design.

Consequently, hardware simulation systems have become an important tool for designers. Such systems are known in the art and aid in the development of integrated circuits and system designs by quickly and automatically generating a hardware prototype of the integrated circuit or system to be designed from the user's schematic or net list. The prototypes are electrically configurable and can be modified to represent an indefinite number of designs with little or no manual wiring changes or device replacement. The prototypes run at real time or close to real time speed and can be electrically connected directly to a larger system. Typical systems include means for connecting large VLSI chips, basic devices, or memory devices into the prototype and run as part of the emulated system.

These devices typically include an emulation array, which is an array of electrically programmable gate arrays (PGAs) used to emulate the necessary logic functions and connect them together into a complete design. The PGAs provide both logic implementation of the simulated devices and signal routing between fixed printed circuit board traces. Few or no manual steps, such as wire wrapping, or placement of pals, are required to modify the design.

These systems for physical emulation of electronic circuits or systems also typically include a data entry work station where a user can input data representing the circuit or system configuration. This data is then converted to a form suitable for programming the array of programmable gate elements with an interconnected architecture. An example of such a system is found in U.S. Pat. No. 5,329,470 to Sample et al. and assigned to Quickturn Systems, Inc.

Such systems have at least one drawback; as the performance of a microprocessor increases, the complexity and the problems associated with simulating and verifying the design also increase. To achieve higher levels of performance in microprocessor designs, superscalar techniques have been used to improve the parallelism in the microprocessor. To support the additional parallelism of such superscalar architectures, multiport RAMs are used. As known to those skilled in the art, these multiport RAMs comprise write multiplexers, a memory array, read multiplexers, read address decode logic, write address decode logic, and write control logic, all in circuit communication.

Examples of multiport RAMs used include (i) a multiport RAM that is 64 bits wide and 32 entries deep with 5 read ports (each needing a 5-bit address) and 6 write ports (each needing a 5-bit address plus one write-enable bit) and (ii) a multiport RAM that is 64 bits wide and 12 entries deep with 8 read ports (each needing a 4-bit address) and 12 write ports (each needing a 4-bit address plus one write-enable bit). With each port being 64 bits wide, the first multiport RAM would need 765=(64*11)+(5*5)+(6*6) I/O pins; the second multiport RAM would need 1372=(64*20)+(8*4)+(12*5) I/O pins. An advanced microprocessor might have many such multiport RAMs.

Obviously, any hardware prototyping system used to evaluate a microprocessor having a number of multiport RAMs must be able to effectively emulate the multiport RAMs in the PGA emulation array. Unfortunately, the technology that emulation systems are based on does not support the use of wide, multiport rams efficiently.

A partitioning problem arises when structure to be prototyped requires more resources than the prototyping technology provides. In the case of multiport RAMs, the limiting resource is the amount of logic and the number of input and output (I/O) pins that can be placed on a single PGA within the emulation technology. When either of these values are exceeded, the prototyping system cannot be used to emulate the design.

In short, complex multiport RAMs require that large amounts of data flow both in and out of each memory location. The number of I/O pins required to emulate a multiport RAM quickly exceeds the number of available pins in the emulation technology.

One possible response, suggested by a major manufacturer of emulations systems, is to implement the multiport RAMs with flip flops and associated combinatorial logic. However, this would results in PGA counts in the hundreds and would require the purchasing of additional PGA arrays for the prototyping system, which can involve considerable expense. For example, using the major manufacturer's partitioner, to emulate a multiport RAM having a width of 83 bits, a depth of 12 entries, 8 write ports, 11 read ports, and having 1653 I/O lines would require approximately 350 PGAs! With PGA counts in the hundreds, the hardware emulation of such devices is not feasible.

SUMMARY OF THE INVENTION

According to the present invention, a partitioning unit is provided that divides the multiport RAM into numerous portions or "slices," each of which is capable of being emulated in a single PGA. In one embodiment, each slice is essentially a multiport RAM of smaller bit-width, but with the same depth and with the same number of read and write ports. In another embodiment, each slice is either a write slice or a read slice. Write slices comprise write multiplexer banks and register banks from a multiport RAM of smaller bit-width, but with the same depth and with the same number of write ports as the multiport RAM being emulated. Read slices comprise read multiplexer banks from a multiport RAM of smaller bit-width, possibly different from the bit-width of the write slices, but with the same depth and with the same number of read ports as the multiport RAM being emulated. Using the partitioning unit of the present invention, the sample multiport RAM having a width of 83 bits, a depth of 12 entries, 8 write ports, 11 read ports, and having 1653 I/O lines only requires approximately 72 PGAs to emulate, which involves an almost five times reduction in the number of PGAs needed!

In the first embodiment, the partitioning unit divides the multiport RAM into a number of whole slices, each of which is emulated by a single PGA. In this embodiment, each whole slice is essentially a multiport RAM of smaller bit-width, but with the same depth and with the same number of read and write ports as the multiport RAM being emulated. The slice bit-width is calculated by dividing the difference between the number of pins per PGA and the sum of the number of read address pins and write address pins by the sum of the read ports and write ports. The number of whole slices, which is the number of PGAs in this embodiment, is calculated by dividing the number of bits of width of the multiport RAM by the slice bit-width.

In the first example above (64-bit, 32-entry, 5 read ports, 6 write ports), the 765 I/O pins are distributed into slices that are three (integer((100−25−36)/(5+6))=3) bits wide. With 64 bits total, the number of slices is 22 (integer(64/3)=22); therefore, 22 PGAs are needed to implement this particular multiport RAM.

In this case, the slices are a three bits wide by 32 memory locations deep memory with five three-bit read ports and six three-bit write ports. Each slice comprises a three bits wide by 32 entries deep memory array, a read multiplexer connecting the memory array to the five three-bit read ports, and a write multiplexer connecting the memory array to the six three-bit write ports. As the slices are combined into the 22 PGAs, there is duplication of the address decoder circuitry, but the design can be emulated by a system having far fewer 100-pin PGAs.

In the second embodiment, the partitioning unit divides the multiport RAM into a number of read slices and a number of write slices. In this embodiment, each write slice is essentially the write multiplexers and memory array of a multiport RAM of smaller bit-width, but with the same depth and with the same number of write ports as the multiport RAM being emulated. Likewise, each read slice is essentially the read multiplexers of a multiport RAM of smaller bit-width but with the same number of read ports as the multiport RAM being emulated.

The read slice bit-width is calculated by dividing the difference between the number of pins per PGA and number of read address pins by the sum of the memory depth and the number of read ports. The number of read slices is calculated by dividing the number of bits of width of the multiport RAM by the read slice bit-width. The write slice bit-width is calculated by dividing the difference between the number of pins per PGA and number of write address pins by the sum of the memory depth and the number of write ports. The number of write slices is calculated by dividing the number of bits of width of the multiport RAM by the write slice bit-width. The total number of PGAs needed to emulate the multiport RAM is the total of the number of write slices and the number of read slices.

In the second example above (64-bit, 12-entry, 8 read ports, 12 write ports), the 1372 I/O pins are distributed into read slices that are three (integer((100−32)/(12+8))=3) bits wide and write slices that are two (integer((100−48)/(12+12))=2) bits wide. With 64 bits total, the number of read slices is 22 (rounded-up(64/3)=22) and the number of write slices is 32 (rounded-up(64/2)=32); therefore, 54 PGAs are needed to implement this particular multiport RAM.

In this case, the write slices comprise a two bits wide by 12 entries deep memory array and a write multiplexer connecting the memory array to the six two-bit write ports. The read slices comprise a read multiplexer connecting the memory array contained in the write slices to the five three-bit read ports. Various portions of the outputs of the memory array are combined to allow the two-bit memory array values to interface to the three-bit read multiplexers; the two-bit outputs from the memory array are redistributed among the three-bit read multiplexers. As the slices are combined into the 54 PGAs, there is some duplication of the address decoder circuitry, but the design can be emulated by a system having far fewer 100-pin PGAs.

It is therefore an advantage of the present invention to provide an apparatus and method for emulating a circuit having a multiport RAM that requires more I/O pins and/or logic than the largest PGA in the emulation array.

It is a further advantage of this invention to provide an apparatus and method for emulating a circuit having a multiport RAM that requires more I/O pins and/or logic than the largest PGA in the emulation array that divides the multiport RAM into a number of smaller multiport RAMs, each of which is contained in a PGA.

It is another advantage of this invention to provide an apparatus and method for emulating a circuit having a multiport RAM that requires more I/O pins and/or logic than the largest PGA in the emulation array that divides the multiport RAM into a number of smaller portions of multiport RAMs, each of which is contained in a PGA.

These and other advantages of the present invention will become more apparent from a detailed description of the invention.

BRIEF DESCRIPTION OF THE DRAWINGS

In the accompanying drawings, which are incorporated in and constitute a part of this specification, embodiments of the invention are illustrated, which, together with a general description of the invention given above, and the detailed description given below serve to example the principles of this invention.

DETAILED DESCRIPTION OF THE PREFERRED EMBODIMENT

Figure 1:
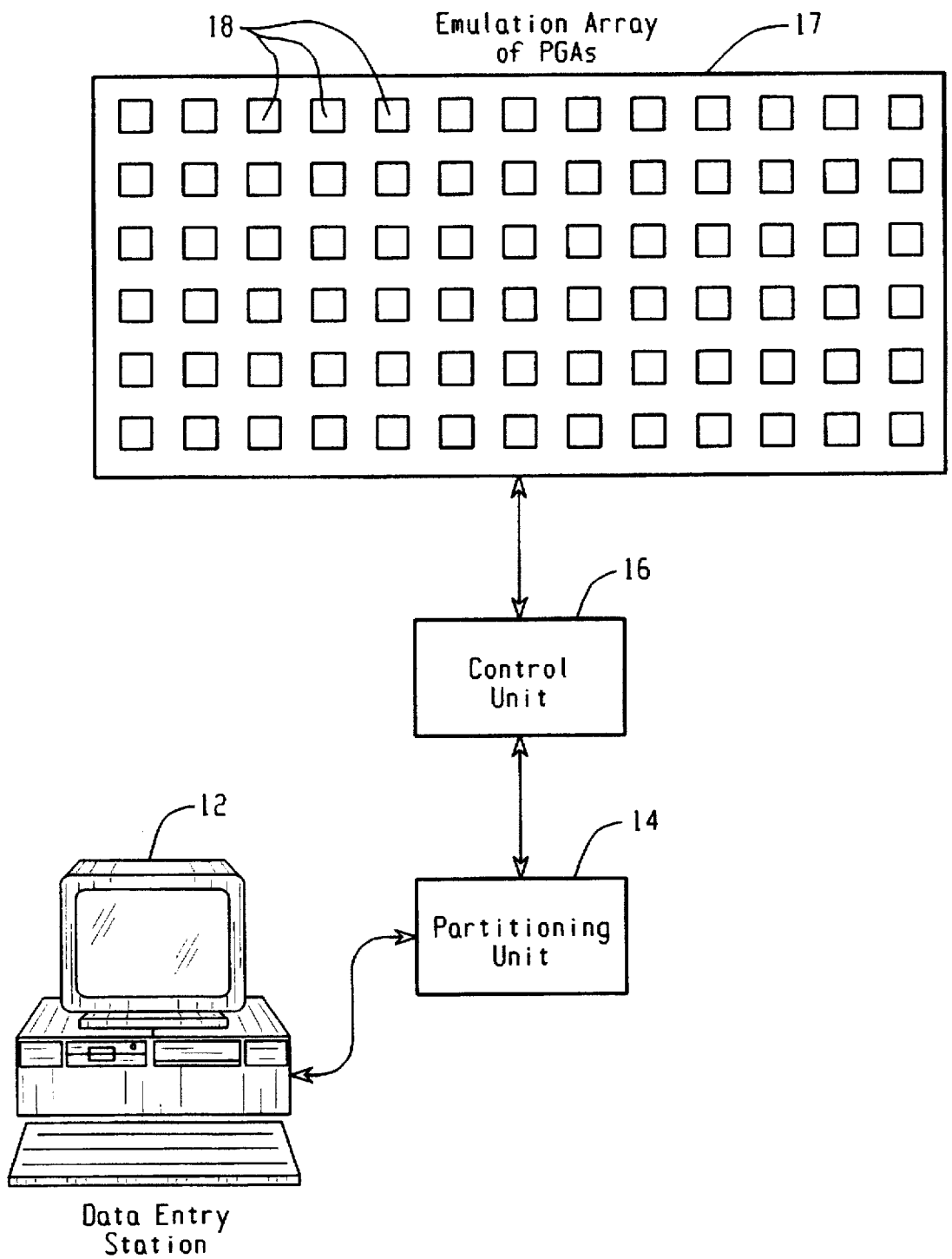
FIG. 1 is a block diagram of the emulation system of the present invention.

Referring now to FIG. 1, an emulation system 10 according to the present invention is shown. The system 10 comprises a data entry station 12, a partitioning unit 14, a control unit 16, and an emulation array 17, which has a plurality of programmable gate arrays (PGAs) 18 interconnected as is known in the art.

With the exception of the partitioning unit 14 of the present invention, emulation systems having a data entry station 12, a control unit 16, and an emulation array are known to those skilled in the art. For example, U.S. Pat. No. 5,329,470 to Sample et al. and assigned to Quickturn Systems, Inc., describes such a system. This system also has a prior art partitioning unit, but results in partitions requiring two to six times the number of PGAs needed to emulate complex multiport RAMs. In fact, the partitioning unit 14 of the present invention is configured to interface with a Quickturn emulation system, as well as other systems capable of emulating circuits described in netlist formats.

Figure 2A:
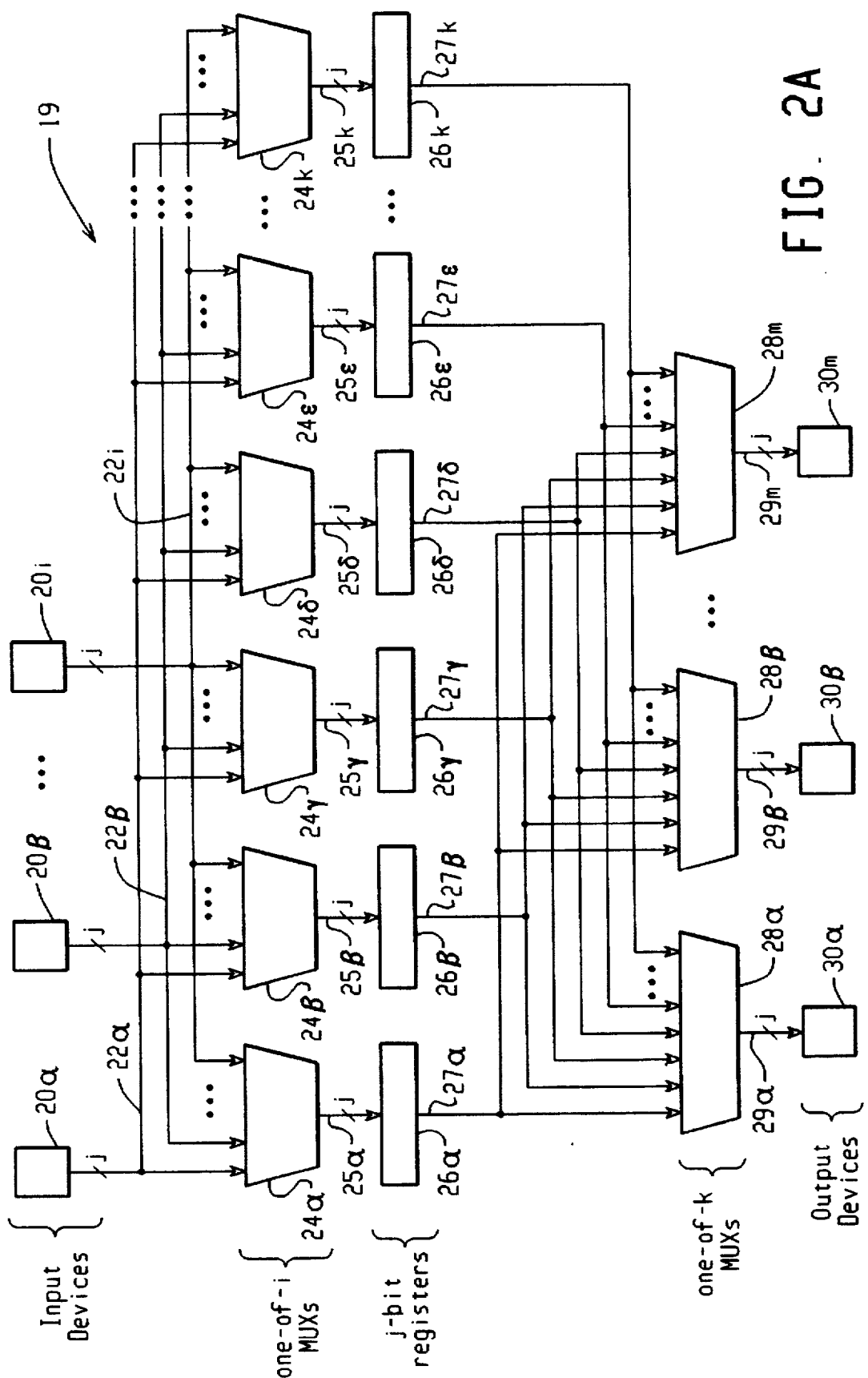
FIG. 2A is a block diagram of a complex multiport RAM suitable for emulation by the emulation system of the present invention, with the address decode logic omitted for clarity.

Before describing the details of the partitioning unit 14 of the present invention, a description of a generic complex multiport RAM may be helpful in understanding the advantages of the partitioning unit 14 of the present invention. Reference is had, therefore, to FIG. 2A, which shows a generic complex multiport RAM 19. Multiport RAMs are typically characterized by their width in bits, depth in width units, number of write ports and number of read ports. The multiport RAM 19 is typically in circuit communication with a number of input devices 20α-20i, one for each write port and each having a j-bit bus 22 associated therewith. The multiport RAM 19 comprises a number of j-bit, one-of-i write multiplexers 24α-24k in circuit communication with the input devices 20α-20i via the j-bit buses 22α-22i. The write multiplexers 24α-24k are also in circuit communication via a number of j-bit buses 25α-25k with a number of j-bit registers 26α-26k. The j-bit registers 26α-26k are in circuit communication via a number of j-bit buses 27α-27k with a number of j-bit, one-of-k read multiplexers 28α-28m. The read multiplexers 28α-28m are typically in circuit communication via a number of j-bit buses 29α-29m with a number of output devices 30α-30m, which read data from the multiport RAM 19.

Although not shown in the figures, each input device 20 has an address bus, write enable pin, and write control logic associated therewith. The write control logic comprises write address decode logic and write control logic. The write address decode logic accepts the address lines (also not shown) from each input device 20 and generates signals necessary to select the write multiplexer 24 and the register 26 associated with the address asserted by the input device 20 onto its address bus. Therefore, the write address decode logic is in circuit communication with its associated input device 20, all the write multiplexers 24α-24k, and all the registers 26α-26k. The write control logic accepts the write enable signal from its respective input device 20 and, along with its associated write address decode logic, latches data into the register 26 associated with the address asserted by the input device 20 onto its address bus. Therefore, the write control logic is in circuit communication with its associated input device 20, its associated write address decode logic, and all the registers 26α-26k.

Similarly, although not shown in the figures, each output device 30 has read control logic associated therewith, which comprises read address decode logic. The read address decode logic accepts the address lines (also not shown) from each output device 30 and generates signals necessary to select the register 26 and select the output of its associated read multiplexer 28 associated with the address asserted by the output device 30 onto its address bus. Therefore, the read address decode logic is in circuit communication with its associated output device 30, its associated read multiplexer 28, and all the registers 26α-26k.

Figure 2B:
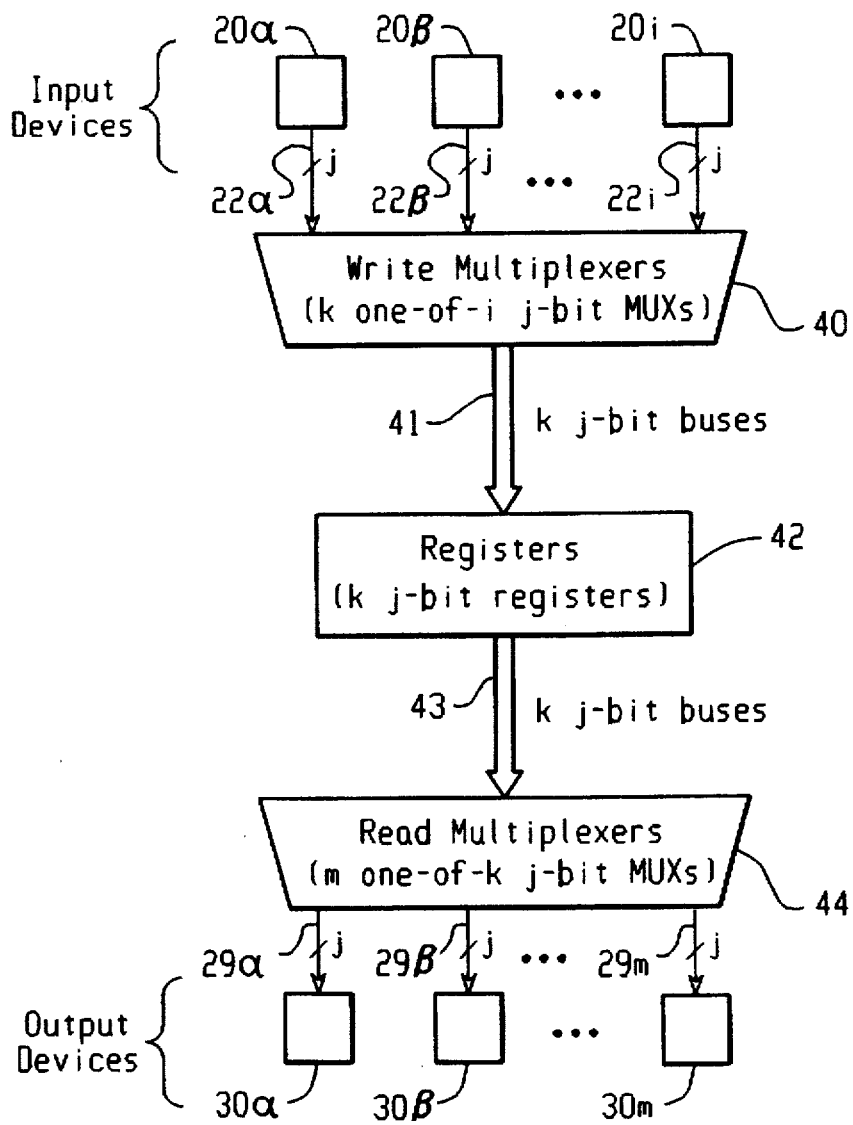
FIG. 2B is the block diagram of FIG. 2A redrawn in a more compact format to facilitate understanding of partitioning by the emulation system of the present invention.

FIG. 2B shows the multiport RAM 19 of FIG. 2A redrawn in a more compact format to facilitate understanding of partitioning by the partitioning unit 14 of the present invention. In FIG. 2B, the k write multiplexers 24α-24k are represented by a write multiplexer bank 40, which is essentially k one-of-i, j-bit multiplexers. The k j-bit buses 25α-25k are represented by bus 41. The k j-bit registers 26α-26k are represented by register bank 42. The k j-bit buses 27α-27k are represented by bus 43. Finally, the m write multiplexers 28α-28m are represented by a read multiplexer bank 44, which is essentially m one-of-k, j-bit multiplexers.

The partitioning unit 14 of the present invention partitions the multiport RAM 19 into numerous portions or "slices," each of which is capable of being emulated in a single PGA 18. For example, if 100-pin PGAs 18 are used in the emulation array 17, each of the slices can have no more than 100 I/O pins. In a first embodiment, each slice is essentially a multiport RAM of smaller bit-width, but with the same depth and with the same number of read and write ports as the multiport RAM being emulated. In a second embodiment, each slice is either a write slice or a read slice. Write slices comprise write banks and register banks from a multiport RAM of smaller bit-width, but with the same depth and with the same number of write ports as the multiport RAM being emulated. Read slices comprise read multiplexer banks from a multiport RAM of smaller bit-width, possibly different from the bit-width of the write slices, but with the same depth and with the same number of read ports as the multiport RAM being emulated.

Figure 3:
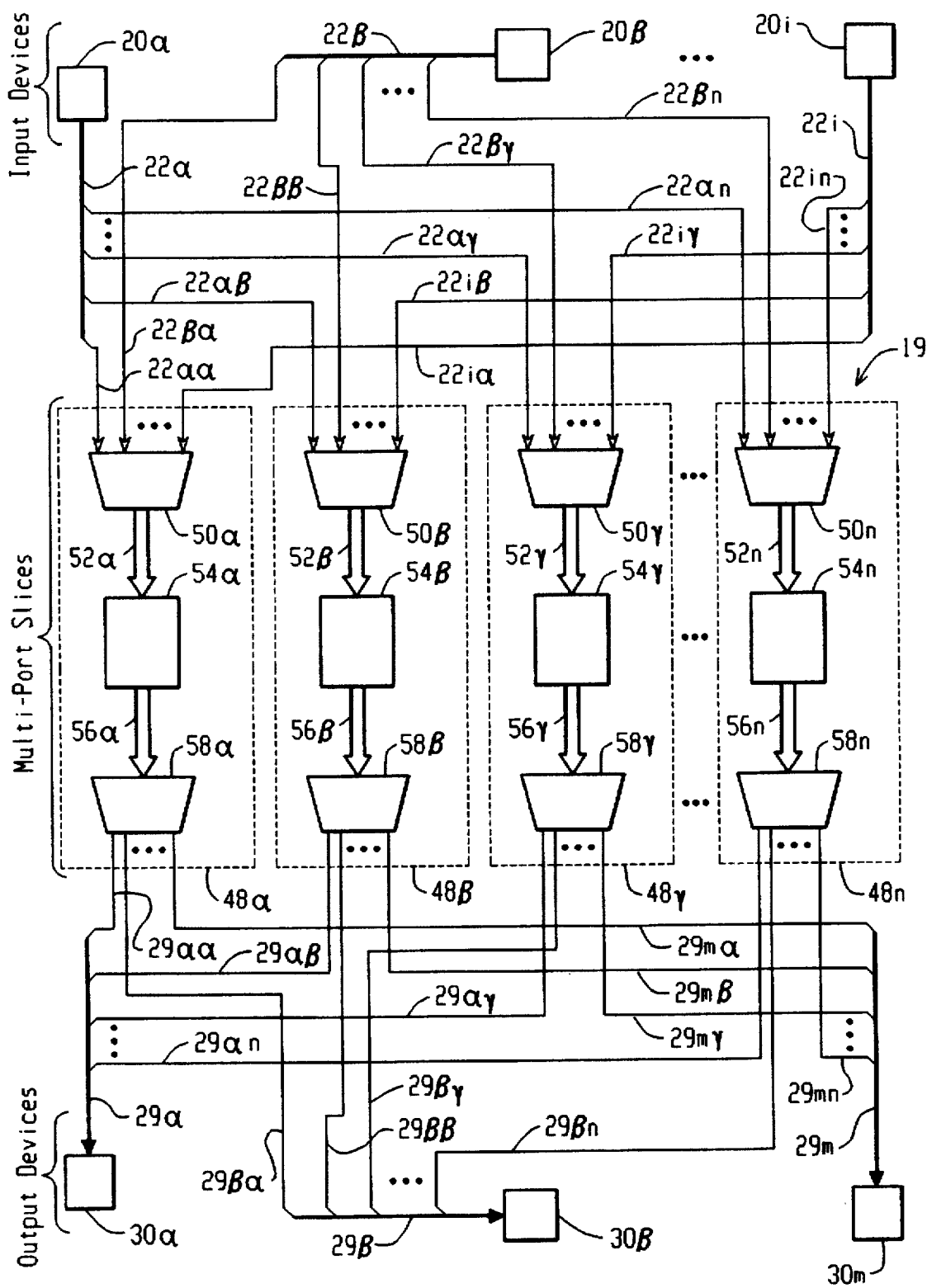
FIG. 3 is a multiport RAM as partitioned by a first embodiment of the emulation system of the present invention.

FIG. 3 shows a multiport RAM 19 partitioned by the first embodiment of the present invention. As shown in that figure, in the first embodiment the partitioning unit divides the multiport RAM 19 into a number of whole slices 48α-48n, each of which is capable of being emulated by a single PGA 18. In this embodiment, each whole slice 48 is essentially a multiport RAM of smaller bit-width, but with the same depth and with the same number of read and write ports as the multiport RAM 19 being emulated. Thus, in the first embodiment, the multiport RAM 19 is divided into n smaller multiport RAMs 48α-48n.

The n slices 48α-48n of the partitioned multiport RAM 19 are connected to the input devices 20α-20i by splitting up the j-bit buses 22α-22i into n smaller buses. In FIG. 3, j-bit bus 22α is divided into n portions: 22αα, 22αβ, 22αγ, . . . 22αn. Likewise, the other j-bit buses 22β-22i are divided into n portions, as shown in the figure. Each of these smaller buses 22αα-22in has the same width as the slice bit-width, with the exception that the buses 22αn-22in from the last input device 20i will be narrower if the slice bit-width is not an mathematical factor of the RAM bit-width. That is, if the slice bit-width is not an mathematical factor of the RAM bit-width, then the last narrower buses 22αn-22in will have a width equal to the remainder that results from dividing the RAM bit-width by the slice bit-width.

Similarly, the n slices 48α-48n of the partitioned multiport RAM 19 are connected to the output devices 30α-30m by splitting up the j-bit buses 29α-29m into n smaller buses. In FIG. 3, j-bit bus 29α is divided into n portions: 29αα, 29αβ, 29αγ, . . . 29αn. Likewise, the other j-bit buses 29β-29m from the output devices 30 are divided into n portions, as shown in the figure. Each of these smaller buses 29αα-29in has the same width as the slice bit-width, with the exception that the buses 29αn-29in from the last input device 20i will be narrower if the write slice bit-width is not an mathematical factor of the RAM bit-width, as explained above.

The slice bit-width is calculated by dividing the difference between the number of pins per PGA 18 and the sum of the number of read address pins and write address pins by the sum of the read ports and write ports, and rounding down:

$$\text{slice bit-width} = \text{integer}\left(\frac{\text{PGA pins-read addr-write addr}}{\text{read ports + write ports}}\right)$$

The number n of whole slices 48, which is the number of PGAs in this embodiment, is calculated by dividing the number of bits of width of the multiport RAM by the slice bit-width, and rounding up:

$$\text{number of slices} = \text{rounded up}\left(\frac{\text{RAM bit-width}}{\text{slice bit-width}}\right)$$

In the first example above (64-bits wide, 32 entries deep, 5 read ports, and 6 write ports), the 765 I/O pins are distributed into slices that are three bits wide (integer((100−25−36)/(5+6))=3). With 64 bits of width total, the number Of slices is 22 (rounded-up(64/3)=22); therefore, n=22 for this particular multiport RAM and 22 PGAs are needed to emulate it. Since the slice bit-width (3) is not an mathematical factor of RAM bit-width (64), i.e., 64÷3=21 remainder 1), the first 21 slices/PGAs will be the same configuration (3 bits wide), but the twenty-second slice/PGA will be of a different size (1 bit wide).

Each of the slices 48 comprise a write multiplexer bank 50 connected via buses 52 to a memory array 54, which is connected via buses 56 to a read multiplexer bank 58. With i being the number of write ports, j being the RAM bit-width, k being the RAM depth, m being the number of read ports, and n being the calculated number of slices, the write multiplexer bank 50 comprises k one-of-i multiplexers having a width equal to the slice bit-width. Similarly, the buses 52 and 56 comprise k buses having a width equal to the slice bit-width. Likewise, the memory array 54 comprises k registers each having a width equal to the slice bit-width. Finally, the read multiplexer bank 58 comprises m one-of-k multiplexers having a width equal to the slice bit-width.

In this example, the slices 48 comprise a three bits wide by 32 entries deep memory with five three-bit read ports and six three-bit write ports. Each of the 22 slices 48 comprise a write multiplexer bank 50, which comprises 32 one-of-five 3-bit multiplexers, connected via 32 3-bit buses 52 to a 3-bit wide by 32 entries deep memory array 54, which is connected via 32 3-bit buses 56 to a read multiplexer bank 58, which comprises 32 one-of-six 3-bit multiplexers. As the slices are combined into the 22 PGAs, there is duplication of the address decoder circuitry (not shown in the figures), but the design can be emulated by a system having far fewer 100-pin PGAs than would otherwise be required.

Figure 4:
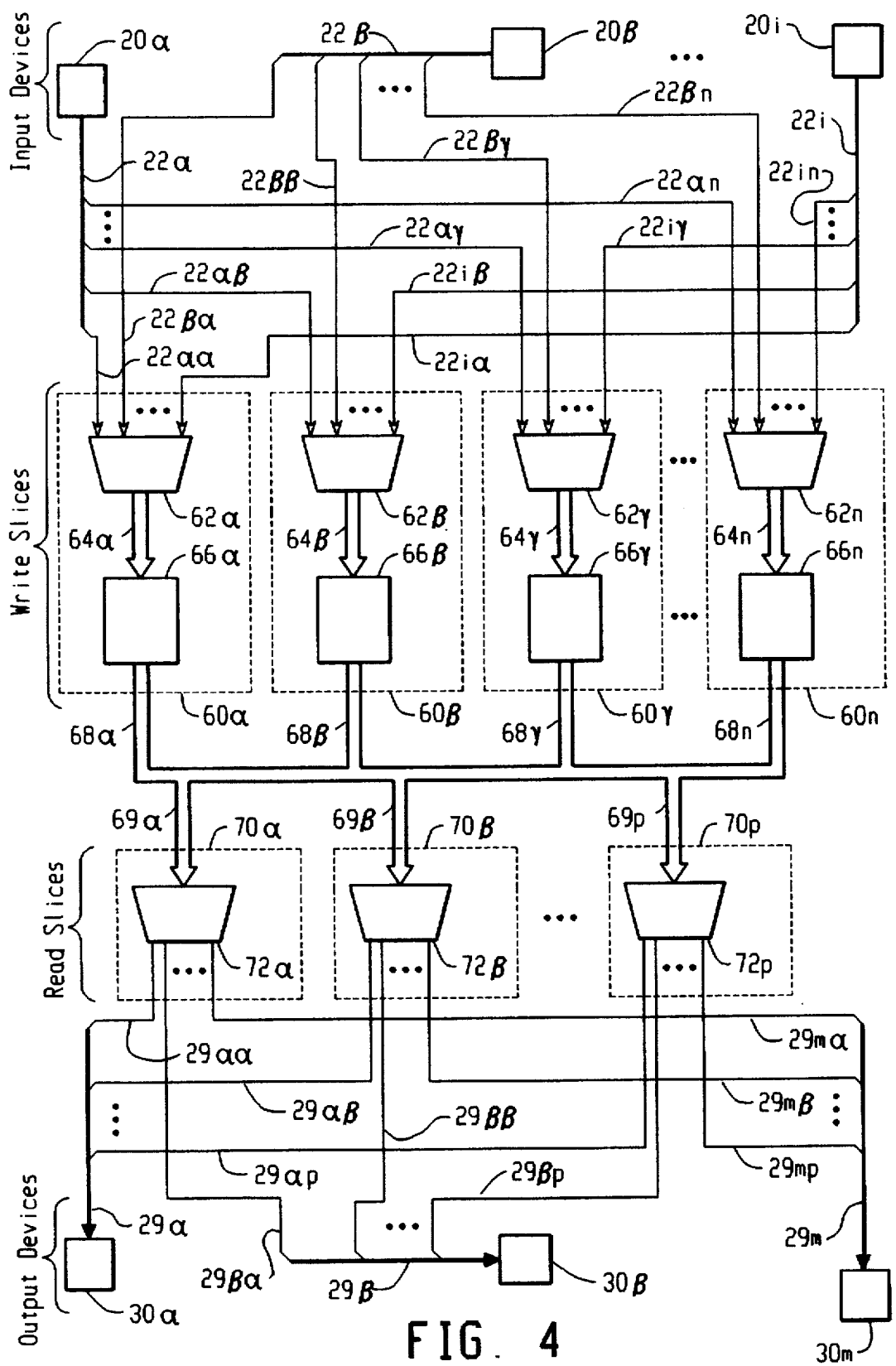
FIG. 4 is a multiport RAM as partitioned by a second embodiment of the emulation system of the present invention.

A multiport RAM partitioned using the second embodiment is shown in FIG. 4. In the second embodiment, the partitioning unit divides the multiport RAM into n write slices 60 and p read slices 70, each of which are emulated by a single PGA.

In this embodiment, each write slice 60 is essentially the write multiplexers and memory array of a multiport RAM of smaller bit-width, but with the same depth and with the same number of read and write ports as the RAM being emulated. Likewise, each read slice 68 is essentially the read multiplexers of a multiport RAM of possibly different bit-width that the write slices, of smaller bit-width than the RAM being emulated, but with the same number of read ports as the RAM being emulated.

As with the multiport RAM partitioned by the partitioning unit 14 of the first embodiment, the n write slices 60α-60n of the multiport RAM 19 partitioned by the partitioning unit 14 of the second embodiment are connected to the input devices 20α-20i by splitting up the j-bit buses 22α-22i into n smaller buses. In FIG. 3, j-bit bus 22α is divided into n portions: 22αα, 22αβ, 22αγ, . . . 22αn. Likewise, the other j-bit buses 22β-22i from the input devices 20 are divided into n portions, as shown in the figure. Each of these smaller buses 22αα-22in has the same width as the write slice bit-width, with the exception that the buses 22αn-22in from the last input device 20i will be narrower if the write slice bit-width is not an mathematical factor of the RAM bit-width, as explained above.

Similarly, the p read slices 70α-70n of the multiport RAM 19 partitioned by the partitioning unit 14 of the second embodiment are connected to the output devices 30α-30m by splitting up the j-bit buses 29α-29m into p smaller buses. In FIG. 4, j-bit bus 29α is divided into p portions: 29αα, 29αβ, 29αγ, . . . 29αp. Likewise, the other j-bit buses 29β-29m from the output devices 30 are divided into p portions, as shown in the figure. Each of these smaller buses 29αα-29ip has the same width as the read slice bit-width, with the exception that the buses 29αp-29ip from the last input device 20i will be narrower if the write slice bit-width is not an mathematical factor of the RAM bit-width, as explained above.

The read slice bit-width is calculated by dividing the difference between the number of pins per PGA and number of read address pins by the sum of the memory depth and the number of read ports, and rounding down to the nearest integer:

$$\text{read slice bit-width} = \text{integer}\left(\frac{\text{PGA pins-read addr}}{\text{RAM depth + read ports}}\right)$$

The number of read slices is calculated by dividing the number of bits of width of the multiport RAM by the read slice bit-width, and rounding up to the nearest integer:

$$\text{number of read slices} = \text{rounded up}\left(\frac{\text{RAM bit-width}}{\text{read slice bit-width}}\right)$$

The write slice bit-width is calculated by dividing the difference between the number of pins per PGA and number of write address pins by the sum of the memory depth and the number of write ports, and rounding down to the nearest integer:

$$\text{write slice bit-width} = \text{integer}\left(\frac{\text{PGA pins-write addr}}{\text{RAM depth + write ports}}\right)$$

The number of write slices is calculated by dividing the number of bits of width of the multiport RAM by the write slice bit-width, and rounding up to the nearest integer:

$$\text{number of write slices} = \text{rounded up}\left(\frac{\text{RAM bit-width}}{\text{write slice bit-width}}\right)$$

The total number of PGAs needed to emulate the multiport RAM is the total of the number of write slices and the number of read slices.

In the second example above (64-bit, 12-entry, 8 read ports, 12 write ports), the 1372 I/O pins are distributed into read slices that are three (integer((100−32)/(12+8))=3) bits wide and write slices that are two (integer((100−48)/(12+12))=2) bits wide. With 64 bits total, the number of read slices is calculated at 22 (rounded-up(64/3)=22) and the number of write slices is calculated at 32 (rounded-up(64/2)=32); therefore, 54 PGAs are needed to implement this particular multiport RAM.

Each of the write slices 60 comprise a write multiplexer bank 62 connected via buses 64 to a memory array 66, which outputs data via buses 68, which are the same width as the write slice bit-width. These buses are rearranged and connected to the read slices 70α-70p. Each of the read slices 70 comprise a read multiplexer bank 72. With i being the number of write ports, j being the RAM bit-width, k being the RAM depth, m being the number of read ports, n being the calculated number of write slices 60, and p being the calculated number of read slices 70, the write multiplexer bank 62 comprises k one-of-i multiplexers having a width equal to the write slice bit-width. Similarly, the buses 64 and 68 comprise k buses having a width equal to the write slice bit-width. Likewise, the memory array 66 comprises k registers each having a width equal to the write slice bit-width. The buses 69 comprise k buses having a width equal to the read slice bit-width. Finally, the read multiplexer bank 72 comprises m one-of-k multiplexers having a width equal to the read slice bit-width. As mentioned above, if either the write slice bit-width or the read slice bit-width is not a factor of the multiport RAM bit-width, then the last slice will not be as wide as the others.

In this example, the write slices 60 comprise a two bits wide by 12 entries deep memory with 12 two-bit write ports. Each of the 32 write slices 60 comprise a write multiplexer bank 62, which comprises 12 one-of-twelve 2-bit multiplexers, connected via 12 2-bit buses 64 to a 2-bit wide by 12 entries deep memory array 66, which outputs data via 12 2-bit buses 68.

Various portions of the outputs of the memory array 66 are combined to allow the two-bit memory array values to interface to the three-bit read multiplexers; the two-bit outputs from the memory array 66 are redistributed among the three-bit read multiplexers 72. Thus the 12 2-bit buses 68 are rearranged to form 12 3-bit buses 69, which are the inputs to the read slices 70. For example, buses 68α, 68β, and 68γ each comprise 12 2-bit buses for a total of 12 6-bit buses. Similarly, buses 69α and 69β each comprise 12 3-bit buses for a total of 12 6-bit buses. Finally, the buses 68β can be split into two groups of 12 1-bit buses. These buses can be arranged as follows: (i) the 12 2-bit buses 68α and 12 1-bit buses from buses 68β become the 12 3-bit buses 69α and (ii) the other 12 1-bit buses from buses 68β and the 12 2-bit buses 68γ become the 12 3-bit buses 69β.

The read slices 70 comprise a read multiplexer bank 72, which comprises 8 one-of-twelve 3-bit multiplexers. As the read slices 70 and write slices 60 are combined into the 54 PGAs, there is duplication of the address decoder circuitry (not shown in the figures), but the design can be emulated by a system having far fewer 100-pin PGAs than would otherwise be required.

Figure 5:
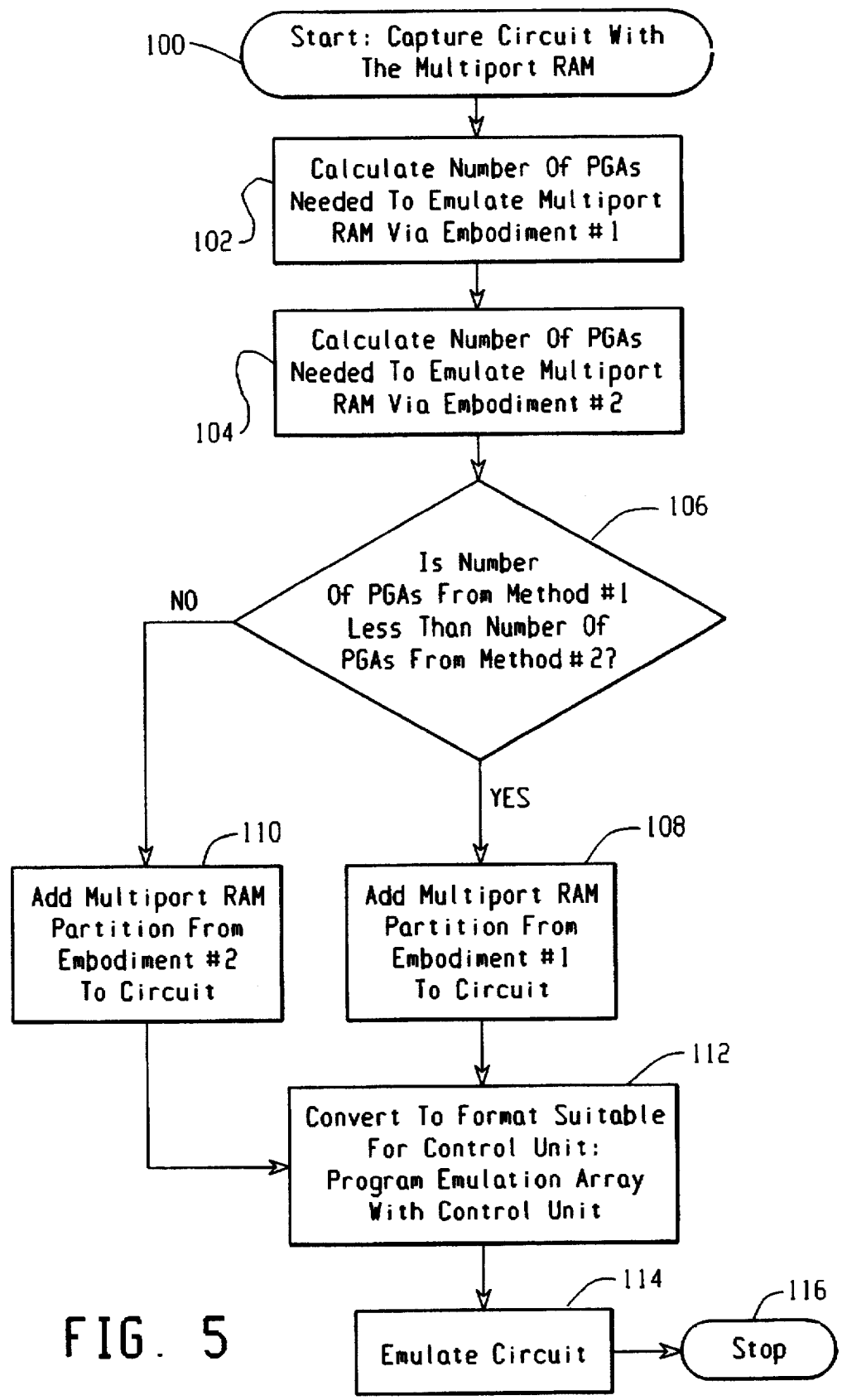
FIG. 5 is a flow chart showing the details of the multiport RAM partition unit of the present invention.

Referring now to FIG. 5, the operational details of the system 10 of the present invention, including partition unit 14, are shown. As implemented, the partition unit 14 according to the present invention is written in C and compiled with any C compiler meeting the ANSI standard. The system starts at 100 by capturing the circuit having the multiport RAM using the data entry station. As known to those skilled in the art, this can take the form of schematic capture of the circuit or accepting a textual representation of the circuit.

Next, the partition unit 14 calculates the number of PGAs needed to emulate the multiport RAM using the first embodiment, at 102, as described in the text accompanying FIG. 3. Next, at 104, the partition unit 14 calculates the number of PGAs needed to emulate the multiport RAM using the second embodiment, as described in the text accompanying FIG. 4.

Then, at 106, the partition unit determines which of the two embodiments was most efficient. If the partitioning by the first embodiment will yield a design that can be emulated in fewer PGAs than the second embodiment, then at 108, a VHDL file containing the description of the multiport RAM partitioned by the first embodiment is generated and substituted for the original representation. On the other hand, if the partitioning by the second embodiment yielded a design that can be emulated in fewer PGAs than the first embodiment, then at 110, a VHDL file containing the description of the multiport RAM partitioned by the second embodiment is generated and substituted for the original representation.

As the partitioning unit 14 of the present invention is implemented, in performing the VHDL file generation of task 110, the partitioning occurs in several passes with different parameters being passed to the partitioning logic. The first pass determines the interconnections between the write slices 60 and the read slices 70. The second pass determines the structure of the write slices 60 from parameters generated from the first pass. The third pass determines the structure of the read slices 70 from parameters generated from the first pass. Finally, if either the write slice bit-width or the read slice bit-width is not a factor of the multiport RAM bit-width, then the last slice will not be as wide as the others. Therefore, if necessary, the last pass generates the structure for the end slices, which will be narrower than the other slices. In the alternative, the partitioning logic can be implemented to require only one pass, with the parameters being automatically passed on to the next partitioning stage.

In either event, at 112, the design is then converted to a format suitable for use by the control unit 16, which then programs the emulation array 17. Such programs are known to those skilled in the art. Finally, the circuit is emulated, at 114.

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. For example, the partition unit 14 according to the present invention can be implemented as an integral part of another portion of the system, such as the data entry station 12 or the control unit 16. As another example, the partition unit 14 of the present invention can be modified to partition multiport RAMs and generate a partitioned version of the RAM in other than the VHDL format. Therefore, the invention in its broader aspects is not limited to the specific details, representative apparatus and method, and illustrative examples shown and described. Accordingly, departures may be made from such details without departing from the spirit or scope of the applicant's general inventive concept.

I claim:

1. An emulation system for emulating a circuit having at least one multiport RAM that requires at least two programmable devices to be emulated, comprising:

(a) a plurality of programmable devices;

(b) a configuration unit electrically coupled to said plurality of programmable devices for programming said plurality of programmable devices to emulate the circuit; and (c) a partition unit coupled to said configuration unit for partitioning the at least one multiport RAM into at least two circuit portions, the at least two circuit portions capable of being programmed into two of said programmable devices by said configuration unit, and wherein during emulation there are no logical data flow paths between the at least two circuit portions; and wherein the at least two circuit portions each comprise another multiport RAM having the same depth, number of read ports, and number of write ports as the at least one multiport RAM, but having a narrower width than the at least one multiport RAM.

2. An emulation system for emulating a circuit having at least one multiport RAM that requires at least two programmable devices to be emulated according to claim 1 wherein said partition unit partitions said multiport RAM into a plurality of parallel slices for emulation by said plurality of programmable devices, each of said parallel slices being emulated in a single one of said programmable devices, and wherein during emulation there are no logical data flow paths between the plurality of programmable devices having said plurality of parallel slices programmed therein.

3. An emulation system for emulating a circuit having at least one multiport RAM that requires at least two programmable devices to be emulated, comprising:

(a) a plurality of programmable devices;

(b) a configuration unit electrically coupled to said plurality of programmable devices for programming said plurality of programmable devices to emulate the circuit; and (c) a partition unit coupled to said configuration unit for partitioning the at least one multiport RAM into at least two circuit portions, the at least two circuit portions capable of being programmed into two of said programmable devices by said configuration unit, and wherein during emulation there are no logical data flow paths between the at least two circuit portions; and (1) wherein the at least two circuit portions each comprise an array of storage elements, at least one read multiplexer, and at east one write multiplexer; and (2) wherein (i) the bit-width of a majority of the at least two circuit portions is determined by dividing the difference between the number of pins per programmable device and the sum of the number of read address pins of the at least one read multiplexer and the number of write address pins of the at least one write multiplexer by the sum of the read ports and write ports and (ii) the number of the at least two circuit portions is determined by dividing the bit-width of the at least one multiport RAM by the bit-width of a majority of the at least two circuit portions.

4. An emulation system for emulating a circuit having at least one multiport RAM that requires at least two programmable devices to be emulated according to claim 3 wherein said partition unit partitions said multiport RAM into a plurality of parallel slices for emulation by said plurality of programmable devices, each of said parallel slices being emulated in a single one of said programmable devices, and wherein during emulation there are no logical data flow paths between the plurality of programmable devices having said plurality of parallel slices programmed therein.

5. An emulation system, comprising:

(a) a plurality of programmable devices;

(b) means, coupled to said programmable devices, for emulating a multiport RAM having an array of storage elements accessible via access lines and that requires at least two programmable devices to be emulated, wherein during emulation the logical data flow paths between said at least two programmable devices are limited to the access lines of the array of storage elements.

6. An emulation system for emulating a circuit having at least one multiport RAM that requires at least two programmable devices to be emulated, comprising:

(a) a plurality of programmable devices;

(b) a configuration unit electrically coupled to said plurality of programmable devices for programming said plurality of programmable devices to emulate the circuit; and (c) a partition unit coupled to said configuration unit for partitioning the at least one multiport RAM into at least two circuit portions, the at least two circuit portions capable of being programmed into two of said programmable devices by said configuration unit, and at least one of the at least two circuit portions having an array of storage elements accessible via access lines, and wherein during emulation the logical data flow paths between said at least two circuit portions are limited to the access lines of the array of storage elements.

7. An emulation system for emulating a circuit having at least one multiport RAM that requires at least two programmable devices to be emulated according to claim 6 wherein:

(a) the at least one multiport RAM further includes at least one multiplexer;

(b) the at least two circuit portions comprise first and second circuit portions;

(c) the first circuit portion comprises the array of storage elements; and (d) the second circuit portion comprises the at least one multiplexer.

8. An emulation system for emulating a circuit having at least one multiport RAM that requires at least two programmable devices to be emulated according to claim 6:

(a) wherein said partition unit partitions said multiport RAM into a plurality of parallel read slices and a plurality of parallel write slices for emulation by said plurality of programmable devices, each of said parallel read slices being emulated in a single one programmable device of a first subset plurality of said plurality of programmable devices, each of said parallel write slices being emulated in a single one programmable device of a second subset plurality of said plurality of programmable devices; and (b) wherein during emulation the logical data flow paths between said first subset plurality of said plurality of programmable devices and said second subset plurality of said plurality of programmable devices are limited to the access lines of the array of storage elements.

9. A method of emulating a circuit having at least one multiport RAM that requires at least two programmable devices to be emulated, comprising the steps of:

(a) providing a plurality of programmable devices;

(b) partitioning the at least one multiport RAM into at least two circuit portions, wherein during emulation there are no logical data flow paths between the at least two circuit portions; and (c) programming the at least two circuit portions into at least two of the programmable devices with a configuration unit; and wherein said step of partitioning the at least one multiport RAM into at least two circuit portions comprises the step of partitioning the multiport RAM into at least two circuit portions, each comprising another multiport RAM having the same depth, number of read ports, and number of write ports as the at least one multiport RAM, but having a narrower width than the at least one multiport RAM.

10. A method of emulating a circuit having at least one multiport RAM that requires at least two programmable devices to be emulated according to claim 9 wherein said step of partitioning the at least one multiport RAM includes the step of partitioning said multiport RAM into a plurality of parallel slices for emulation by said plurality of programmable devices, each of said parallel slices suitable for being emulated in a single one of said programmable devices, and wherein during emulation there are no logical data flow paths between the plurality of programmable devices having said plurality of parallel slices programmed therein.

11. A method of emulating a circuit having at least one multiport RAM that requires at least two programmable devices to be emulated, comprising the steps of:

(a) providing a plurality of programmable devices;

(b) partitioning the at least one multiport RAM into at least two circuit portions, at least one of the at least two circuit portions having an array of storage elements accessible via access lines, and wherein during emulation the logical data flow paths between said at least two circuit portions are limited to the access lines of the array of storage elements; and (c) programming the at least two circuit portions into at least two of the programmable devices with a configuration unit.

12. A method of emulating a circuit having at least one multiport RAM that requires at least two programmable devices to be emulated according to claim 11 wherein said step of partitioning the at least one multiport RAM into at least two circuit portions comprises the step of partitioning the multiport RAM into at least two circuit portions, one comprising an array of storage elements and at least one multiplexer, the other comprising at least one multiplexer.

13. A method of emulating a circuit having at least one multiport RAM that requires at least two programmable devices to be emulated according to claim 11:

(a) wherein said step of partitioning the at least one multiport RAM includes the step of partitioning said multiport RAM into a plurality of parallel read slices and a plurality of parallel write slices for emulation by said plurality of programmable devices, each of said parallel read slices being emulated in a single one programmable device of a first subset plurality of said plurality of programmable devices, each of said parallel write slices being emulated in a single one programmable device of a second subset plurality of said plurality of programmable devices; and (b) wherein during emulation the logical data flow paths between said first subset plurality of said plurality of programmable devices and said second subset plurality of said plurality of programmable devices are limited to the access lines of the array of storage elements.

14. An emulation system for emulating a circuit having at least one multiport RAM that requires at least two programmable devices to be emulated, comprising:

(a) a plurality of programmable devices;

(b) a configuration unit electrically coupled to said plurality of programmable devices for programming said plurality of programmable devices to emulate the circuit; and (c) a partition unit coupled to said configuration unit for partitioning the at least one multiport RAM into at least two circuit portions, the at least two circuit portions capable of being programmed into two of said programmable devices by said configuration unit, and wherein during emulation there are no logical data flow paths between the at least two circuit portions; and wherein said partition unit partitions said multiport RAM into a plurality of parallel slices for emulation by said plurality of programmable devices, each of said parallel slices being emulated in a single one of said programmable devices, wherein the multiport RAM has a memory space associated therewith, wherein each of said plurality of slices defines a fixed, nonredundant portion of the memory space, and wherein during emulation there are no logical data flow paths between the plurality of programmable devices having said plurality of parallel slices programmed therein.

15. An emulation system for emulating a circuit having at least one multiport RAM that requires at least two programmable devices to be emulated, comprising:

(a) a plurality of programmable devices;

(b) a configuration unit electrically coupled to said plurality of programmable devices for programming said plurality of programmable devices to emulate the circuit; and (c) a partition unit coupled to said configuration unit for partitioning the at least one multiport RAM into at least two circuit portions, the at least two circuit portions capable of being programmed into two of said programmable devices by said configuration unit, and wherein during emulation there are no logical data flow paths between the at least two circuit portions; and (1) wherein the at least two circuit portions each comprise an array of storage elements, at least one read multiplexer, and at east one write multiplexer; and (2) wherein said partition unit partitions said multiport RAM into a plurality of parallel slices for emulation by said plurality of programmable devices, each of said parallel slices being emulated in a single one of said programmable devices, wherein the multiport RAM has a memory space associated therewith, wherein each of said plurality of slices defines a fixed, nonredundant portion of the memory space, and wherein during emulation there are no logical data flow paths between the plurality of programmable devices having said plurality of parallel slices programmed therein.

16. A method of emulating a circuit having at least one multiport RAM that requires at least two programmable devices to be emulated, comprising the steps of:

(a) providing a plurality of programmable devices;

(b) partitioning the at least one multiport RAM into at least two circuit portions, wherein during emulation there are no logical data flow paths between the at least two circuit portions; and (c) programming the at least two circuit portions into at least two of the programmable devices with a configuration unit; and wherein said step of partitioning the at least one multiport RAM includes the step of partitioning said multiport RAM into a plurality of parallel slices for emulation by said plurality of programmable devices, each of said parallel slices suitable for being emulated in a single one of said programmable devices, wherein the multiport RAM has a memory space associated therewith, wherein each of said plurality of slices defines a fixed, nonredundant portion of the memory space, and wherein during emulation there are no logical data flow paths between the plurality of programmable devices having said plurality of parallel slices programmed therein.

17. A method of emulating a circuit having at least one multiport RAM that requires at least two programmable devices to be emulated, comprising the steps of:
   (a) providing a plurality of programmable devices;
   (b) partitioning the at least one multiport RAM into at least two circuit portions, wherein during emulation there are no logical data flow paths between the at least two circuit portions; and
   (c) programming the at least two circuit portions into at least two of the programmable devices with a configuration unit; and
      (1) wherein said step of partitioning the at least one multiport RAM into at least two circuit portions comprises the step of partitioning the multiport RAM into at least two circuit portions, each comprising an array of storage elements, at least one read multiplexer, and at east one write multiplexer; and
      (2) wherein said step of partitioning the at least one multiport RAM includes the step of partitioning said multiport RAM into a plurality of parallel slices for emulation by said plurality of programmable devices, each of said parallel slices suitable for being emulated in a single one of said programmable devices, wherein the multiport RAM has a memory space associated therewith, wherein each of said plurality of slices defines a fixed, nonredundant portion of the memory space, and wherein during emulation there are no logical data flow paths between the plurality of programmable devices having said plurality of parallel slices programmed therein.

18. An emulation system, comprising:
   (a) a plurality of programmable devices; and
   (b) means, coupled to said programmable devices, for emulating a multiport RAM that requires at least two programmable devices to be emulated; and
      (1) wherein said means for emulating a multiport RAM comprises means for partitioning the multiport RAM into at least two circuit portions, the at least two circuit portions capable of being programmed into two of said programmable devices; and
      (2) wherein the at least two circuit portions each comprise another multiport RAM having the same depth, number of read ports, and number of write ports as the multiport RAM, but having a narrower width than the multiport RAM.

19. An emulation system according to claim 18 wherein during emulation there are no logical data flow paths between the at least two circuit portions.

20. An emulation system, comprising:
   (a) a plurality of programmable devices; and
   (b) means, coupled to said programmable devices, for emulating a multiport RAM that requires at least two programmable devices to be emulated; and
      (1) wherein said means for emulating a multiport RAM comprises means for partitioning the multiport RAM into at least two circuit portions, the at least two circuit portions capable of being programmed into two of said programmable devices;
      (2) wherein the at least two circuit portions each comprise an array of storage elements, at least one read multiplexer, and at east one write multiplexer; and
      (3) wherein (i) the bit-width of a majority of the at least two circuit portions is determined by dividing the difference between the number of pins per programmable device and the sum of the number of read address pins of the at least one read multiplexer and the number of write address pins of the at least one write multiplexer by the sum of the read ports and write ports and (ii) the number of the at least two circuit portions is determined by dividing the bit-width of the at least one multiport RAM by the bit-width of a majority of the at least two circuit portions.

21. An emulation system according to claim 20 wherein during emulation there are no logical data flow paths between the at least two circuit portions.

22. A method of emulating a circuit having at least one multiport RAM that requires at least two programmable devices to be emulated, comprising the steps of:
   (a) providing a plurality of programmable devices;
   (b) partitioning the at least one multiport RAM into at least two circuit portions, wherein the at least two circuit portions each comprise another multiport RAM having the same depth, number of read ports, and number of write ports as the at least one multiport RAM, but having a narrower width than the at least one multiport RAM; and
   (c) programming the at least two circuit portions into at least two of the programmable devices with a configuration unit.

23. A method of emulating a circuit having at least one multiport RAM that requires at least two programmable devices to be emulated according to claim 22 wherein during emulation there are no logical data flow paths between the at least two circuit portions.

24. A method of emulating a circuit having at least one multiport RAM that requires at least two programmable devices to be emulated, comprising the steps of:
   (a) providing a plurality of programmable devices;
   (b) partitioning the at least one multiport RAM into at least two circuit portions, wherein the at least two circuit portions each comprise an array of storage elements, at least one read multiplexer, and at east one write multiplexer, and wherein (i) the bit-width of a majority of the at least two circuit portions is determined by dividing the difference between the number of pins per programmable device and the sum of the number of read address pins of the at least one read multiplexer and the number of write address pins of the at least one write multiplexer by the sum of the read ports and write ports and (ii) the number of the at least two circuit portions is determined by dividing the bit-width of the at least one multiport RAM by the bit-width of a majority of the at least two circuit portions; and
   (c) programming the at least two circuit portions into at least two of the programmable devices with a configuration unit.

25. A method of emulating a circuit having at least one multiport RAM that requires at least two programmable devices to be emulated according to claim 24 wherein during emulation there are no logical data flow paths between the at least two circuit portions.

* * * * *